United States Patent [19]
Tang

[11] Patent Number: 5,937,272
[45] Date of Patent: Aug. 10, 1999

[54] PATTERNED ORGANIC LAYERS IN A FULL-COLOR ORGANIC ELECTROLUMINESCENT DISPLAY ARRAY ON A THIN FILM TRANSISTOR ARRAY SUBSTRATE

[75] Inventor: Ching W. Tang, Rochester, N.Y.

[73] Assignee: Eastman Kodak Company, Rochester, N.Y.

[21] Appl. No.: 08/870,475

[22] Filed: Jun. 6, 1997

[51] Int. Cl.⁶ .......................... H01L 21/00; H01L 21/302
[52] U.S. Cl. ..................... 438/30; 438/158; 438/752
[58] Field of Search ................ 438/30, 158, 752

[56] References Cited

U.S. PATENT DOCUMENTS

| | | | |
|---|---|---|---|
| 4,332,075 | 6/1982 | Ota et al. ................................. | 29/571 |
| 4,356,429 | 10/1982 | Tang . | |
| 4,539,507 | 9/1985 | VanSlyke et al. . | |
| 4,720,432 | 1/1988 | VanSlyke et al. . | |
| 4,769,292 | 9/1988 | Tang et al. . | |
| 4,885,211 | 12/1989 | Tang et al. . | |
| 5,047,687 | 9/1991 | VanSlyke . | |
| 5,059,862 | 10/1991 | VanSlyke et al. . | |
| 5,061,569 | 10/1991 | VanSlyke et al. . | |
| 5,110,748 | 5/1992 | Sarma ..................................... | 437/51 |
| 5,294,870 | 3/1994 | Tang et al. . | |
| 5,308,779 | 5/1994 | Sarma ..................................... | 437/40 |
| 5,438,241 | 8/1995 | Zavracky et al. ................... | 315/169.3 |
| 5,509,861 | 4/1996 | Wacinski . | |
| 5,538,905 | 7/1996 | Nishioka et al. ....................... | 437/24 |
| 5,550,066 | 8/1996 | Tang et al. . | |
| 5,550,070 | 8/1996 | Funai et al. ............................ | 437/41 |
| 5,652,158 | 7/1997 | Bae ................................... | 437/40 TFT |
| 5,821,133 | 10/1998 | Kawai et al. .......................... | 438/30 |

*Primary Examiner*—John F. Niebling
*Assistant Examiner*—Michael S. Lebentritt
*Attorney, Agent, or Firm*—Raymond L. Owens

[57] ABSTRACT

A method of forming high definition patterned organic layers in a full-color electroluminescent (EL) display array on a two-dimensional thin film transistor (TFT) array substrate is described. The substrate has subpixels with each subpixel having raised surface portions and one recessed surface portion which reveals a bottom electrode. Red, green, and blue color forming organic EL layers are formed in the designated subpixels in accordance with a selected color pattern. The method uses a donor support which is coated with a transferable coating of an organic EL material. The donor support is heated to cause the transfer of the organic EL material onto the designated recessed surface portions of the substrate forming the colored EL medium in the designated subpixels. Optical masks and, alternatively, an aperture mask are used to selectively vapor deposit respective red, green, and blue organic EL media into the designated color EL subpixels.

21 Claims, 5 Drawing Sheets

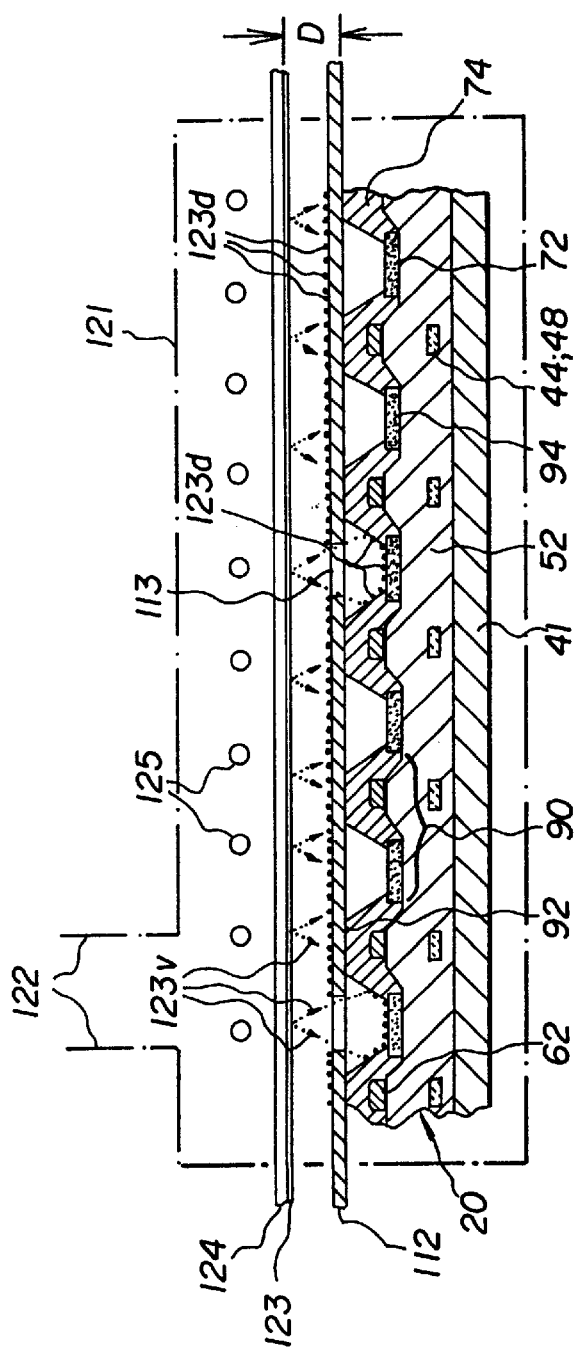
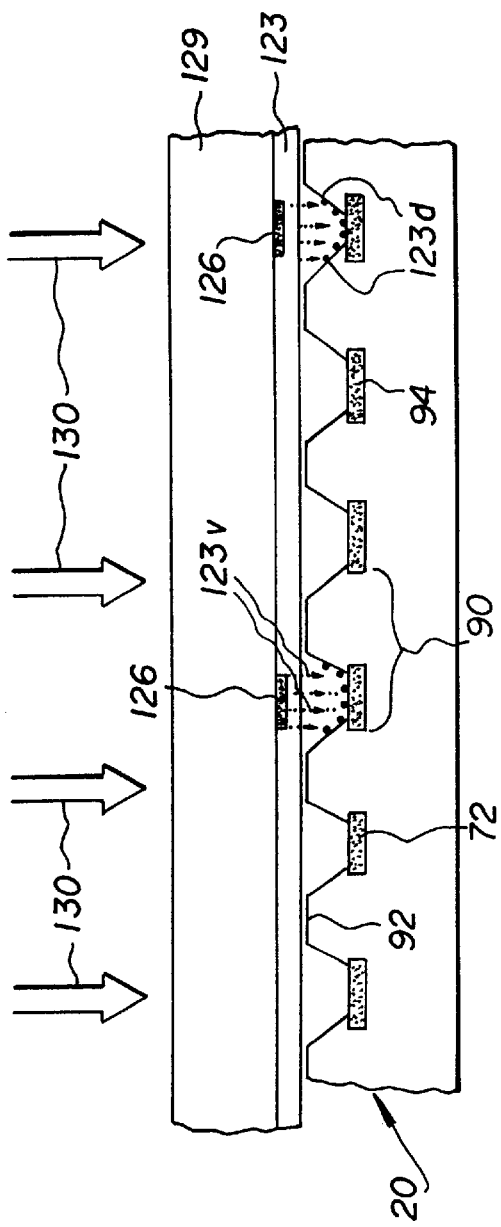
FIG. 1
FIG. 2

PATTERNED ORGANIC LAYERS IN A FULL-COLOR ORGANIC ELECTROLUMINESCENT DISPLAY ARRAY ON A THIN FILM TRANSISTOR ARRAY SUBSTRATE

CROSS REFERENCE TO RELATED APPLICATIONS

The present invention is related to commonly assigned U.S. patent application Ser. No. 08/648,772, filed May 16, 1996, entitled "Method of Forming an Organic Electroluminescent Display Panel" to Littman et al; U.S. patent application Ser. No. 08/788,537 filed Jan. 24, 1997, entitled "Method of Depositing Organic Layers in Organic Light Emitting Devices", to Tang et al; and U.S. patent application Ser. No. 08/355,742, filed Dec. 14, 1994, entitled "TFT-EL Display Panel Using Organic Electroluminescent Media", to Tang et al, the disclosures of which are incorporated herein by reference.

FIELD OF THE INVENTION

The present invention relates to methods of forming patterned organic layers in a full-color electroluminescent (EL) organic display array on a substrate comprised of a two-dimensional thin film transistor (TFT) active matrix array of pixels and subpixels.

BACKGROUND OF THE INVENTION

As disclosed by C. W. Tang et al in commonly assigned U.S. Pat. No. 5,550,066, the utilization of an organic material as the EL medium deposited as a single-color EL layer on a TFT array substrate has numerous advantages over liquid crystal displays (LCD) which are also commonly addressed or selectively actuated by the use of a TFT active matrix array. During the fabrication of the TFT active matrix array, Tang et al show the evolution of substantial topological surface features due to the multilayer design of the TFT array, as particularly evident in FIGS. 4, 5, 6, and 7, all of which show a TFT pixel prior to formation of an organic electroluminescent layer on an upper surface thereof. A single-color EL organic layer 82 is shown in FIGS. 3, 8, and 9 of the above U.S. Pat. No. 5,550,066 as extending with uniform thickness along the entire surface of TFT pixel, as a layer conforming to the topological features of the pixel. Conventional vacuum evaporation was employed as the physical vapor deposition method in forming the EL organic layer. This single-color EL layer did not have to be patterned because the layer only emits light in that region of the pixel where the layer is in electrical contact with both a transparent (ITO) anode bottom electrode and a top electrode 84. Thus, the lateral position of the ITO transparent anode bottom electrode 72 within the pixel provides effectively a self-patterning feature for this single-color (monochrome) device. Each pixel has raised surface portions and a recessed surface portion which also reveals the transparent anode bottom electrode. In a two-dimensional array of such pixels, the deposition of a single-color forming conformal EL layer over the entire surface area of each of the pixels, is advantageous from the viewpoint of simplicity of manufacturing, since such a single-color forming EL layer does not have to be patterned.

For full-color displays, however, it is necessary to provide a suitable method of patterning each pixel of an EL display into three color subpixels capable of generating red, green, or blue light. The present invention provides such methods of patterning, taking advantage of the TFTs topological surface features to form a full-color organic EL display.

SUMMARY OF THE INVENTION

It is an object of the present invention to provide a method of forming a full-color organic EL display.

In one aspect, this object is achieved by a method of forming a full-color organic electroluminescent (EL) display, comprising:

a) providing a substrate for the EL display which contains an array of thin film transistors (TFTs), having a plurality of pixels;

b) forming each pixel with subpixels designated as red, green, and blue color EL subpixels;

c) forming each color EL subpixel with an EL element and at least one TFT;

d) forming each EL element with a bottom electrode on the substrate, an organic EL medium, and a top electrode;

e) locating the bottom electrode in a recessed portion of the color EL subpixel; and f) deposited by vapor deposition the organic EL medium for each of the color EL subpixels through an aperture mask held in contact or close proximity to the substrate.

ADVANTAGES

Major advantages of the method of the invention are formation of high definition organic EL layers with each of the red, green, or blue color forming layers being deposited into recessed surface portions of designated subpixels, from EL donor coatings; excellent utilization of the organic EL materials; excellent uniformity of the deposited layers over a large TFT substrate area; and precise control of the thickness of each layer formed in the designated subpixels.

BRIEF DESCRIPTION OF THE DRAWINGS

FIG. 1 shows schematically in partial cross-sectional view an arrangement for depositing a color forming organic EL layer into designated recessed surface portions of subpixels of a TFT array substrate by an aperture mask method in accordance with the present invention;

FIG. 2 depicts schematically a side view of an arrangement for depositing a color forming organic EL layer into designated recessed surface portions of subpixels of a TFT array substrate by an optical mask method in accordance with the present invention;

Figure 3:
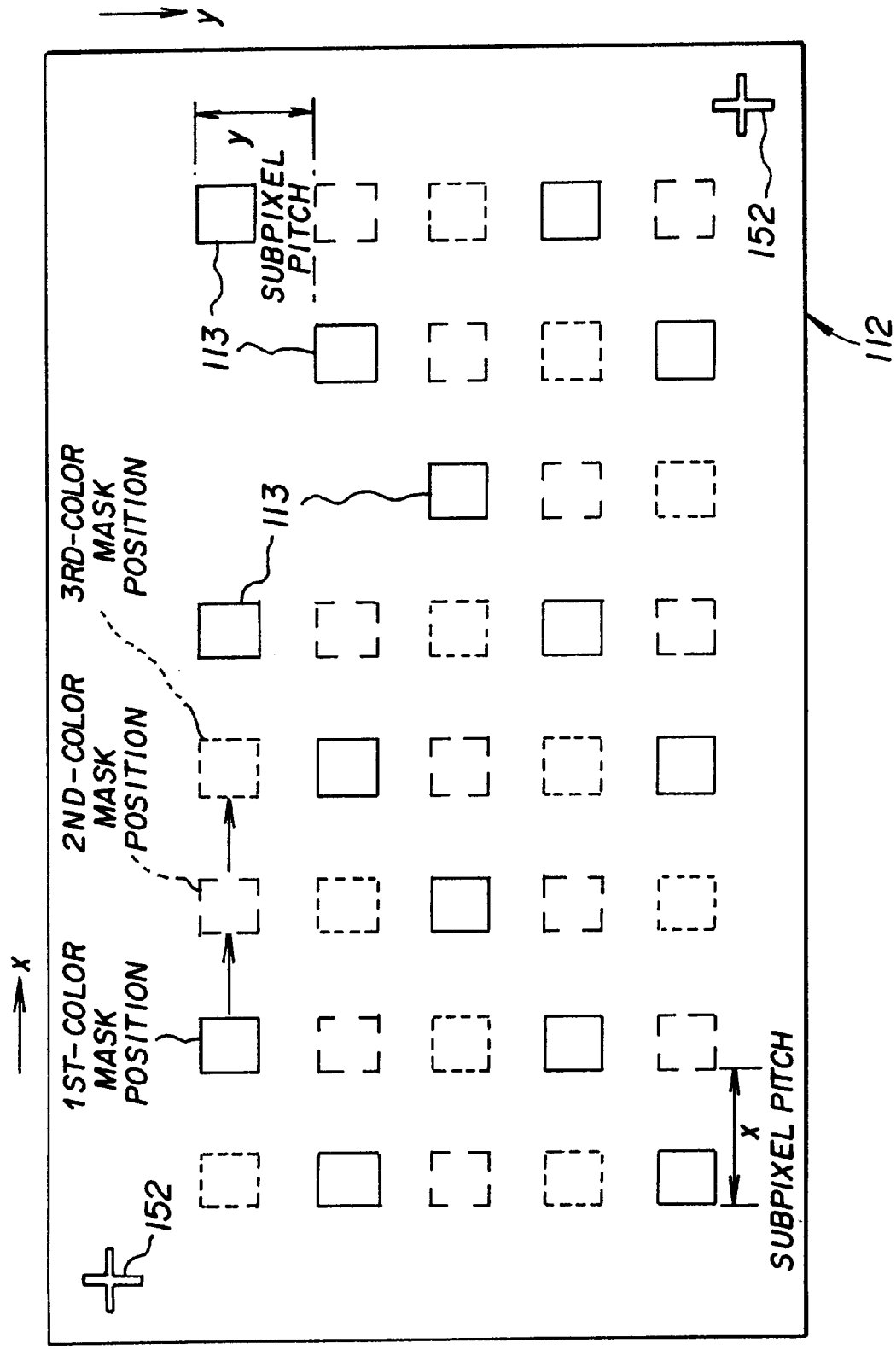
FIG. 3 is a schematic plan view of an aperture mask which is used advantageously in the method of forming organic EL layers by the arrangement shown in FIG. 1.

It will be understood that the drawings are not to scale and have been shown for clarity of illustration.

DETAILED DESCRIPTION OF THE INVENTION

The term "display" or "display panel" is employed to designate a screen capable of electronically displaying video images or text. The term "pixel" is employed in its art recognized usage to designate an area of a display panel that can be stimulated to emit light independently of other areas. The term "multicolor" is employed to describe a display panel that is capable of emitting light of a different hue in different areas. In particular, it is employed to describe a display panel that is capable of displaying images of different colors. These areas are not necessarily contiguous. The term "full-color" is employed to describe multicolor display panels that are capable of emitting in the red, green, and blue regions of the visible spectrum and displaying images in any combination of hues. The red, green, and blue colors constitute the three primary colors from which all other colors can be generated by appropriately mixing these three primaries. The term "hue" refers to the intensity profile of light emission within the visible spectrum, with different hues exhibiting visually discernible differences in color. The pixel or subpixel is generally used to designate the smallest addressable unit in a display panel. For a monochrome display, there is no distinction between pixel or subpixels. The term "subpixel" is used in multicolor display panel and is employed to designate any portion of a pixel which can be independently addressable to emit a specific color. For example, a blue subpixel is that portion of a pixel which can be addressed to emit blue light. In a full-color display, a pixel generally comprises of three primary color subpixels, namely, blue, green, and red. The term "pitch" is used to designate the distance separating two pixels or subpixels in a display panel. Thus, a subpixel pitch means the separation between two subpixels.

Turning now to FIG. 1, there is shown one preferred arrangement for the practice of the method in accordance with the present invention. Arranged within a reduced pressure chamber 121 having a pump port 122 is a TFT active matrix array substrate 20 depicted schematically in cross-sectional view as representing, for example, the major raised and recessed surface portions of a TFT pixel shown in FIG. 9 of the above cited U.S. Pat. No. 5,550,066.

Briefly described, such a pixel is comprised of an insulating transparent substrate 41 and a plurality of layers deposited thereon. Among these layers are two TFTs 44 and 48, an insulating layer 52, an upper electrode 62, a transparent anode bottom electrode 72, and a passivating layer 74. This multilayer construction of each pixel or subpixel of the TFT active matrix array substrate 20 results in raised surface portions 92 of each subpixel (only one most highly raised portion is depicted in the drawings to provide clarity of presentation) and a recessed surface portion 94 which reveals the bottom electrode 72.

An aperture mask 112 is positioned on, or in close proximity to, the raised surface portions 92 of the pixels or subpixels 90 on the TFT substrate 20 in an oriented relationship between the apertures 113 and the designated recessed surface portions 94 of the substrate 20. The oriented relationship between the apertures 113 of the aperture mask 112 and the designated recessed surface portions 94 can be more readily visualized in conjunction with FIG. 3, where orientation marks 152 (also referred to as alignment targets) are shown which are used to orient the aperture mask 112 with respect to matching orientation marks (not shown) on the TFT substrate 20. For example, the aperture mask 112 is oriented with respect to the TFT substrate such that the apertures 113 are positioned in a first-color (for example, a red organic EL medium) mask position over the designated color subpixel portions 94 on the substrate. In a two-dimensional array of TFT subpixels, the subpixels 90 are arranged in rows and orthogonal columns, and the 113 on the aperture mask 112 are similarly arranged in rows and columns, as indicated by the coordinates x and y in FIG. 3, whereby a subpixel pitch in both the x and y directions indicates the distance between subpixels. Depending upon the particular design and layout of the two-dimensional TFT array, a ratio between a subpixel pitch in one direction and in an orthogonal second direction can have a value ranging from 1 to 3.

Still referring to FIG. 3 in conjunction with FIG. 1, the aperture mask 112 is repositioned on the raised surface portions 92 of the TFT active matrix array substrate 20 in an oriented relationship between the apertures 113 and corresponding designated recessed surface portions 94 such that in a second-color (for example, a green organic EL medium) mask position a second-color (e.g., green) organic EL layer can be deposited into designated recessed electrodes of the green subpixels. Similarly, repositioning the apertures 113 into a third-color (for example, a blue organic EL medium) mask position permits deposition of a third-color (e.g., blue) organic EL layer into designated blue recessed surface portions of the TFT array subpixels. In FIG. 3 the plurality of apertures 113 are depicted in a solid outline corresponding to a first-color (e.g., red) mask position, in a dashed outline corresponding to a second-color (e.g., green) mask position, and in a dotted outline corresponding to a third-color (e.g., blue) mask position over the corresponding recessed surface portions of the subpixels 90 in accordance with a selected desired color pattern to be achieved in the full-color EL display array, shown here for illustrative purposes as a diagonal color pattern.

Referring now again to FIG. 1, a donor support 124 having a coating 123 on a surface facing the aperture mask 112, is spaced from the aperture mask by a distance D, which is intended to indicate a distance which ensures a position of a transferable relationship between the coating 123 on the support 124 and the aperture mask 112 with the plurality of apertures 113. The coating 123 is designated as donor coating containing an organic EL medium of a specific color.

A plurality of heating elements 125 is arranged to heat the donor support 124 in a reduced pressure environment to a temperature at which the EL organic material of the donor coating 123 vaporizes as schematically indicated by the dotted vapor arrows 123v, thereby forming a deposited electroluminescent organic layer 123d over the aperture mask 112 and in the designated recessed surface portion 94 of the TFT substrate subpixels 90 through the respective plurality of apertures 113 of the aperture mask 112.

The donor support 124 with donor coating 123 thereupon enters and leaves the chamber 121 through suitably designed ports (not shown). The aperture mask 112 is repositioned with respect to the substrate and translated from a first-color mask position to a second- or third-color mask position through a precise mechanical position aligner (not shown).

The aperture mask is held in contact or close proximity to the substrate, where close proximity is a spacing of less than 250 micrometers between the aperture mask and the raised surface portions 92 of the subpixels.

Prior to actuating the heating elements 125, the chamber 121 is preferably provided with an environment of reduced pressure. In the practice of the present invention, the environment of reduced pressure is preferably at a pressure value of less than 1 Torr during the heating step so that the organic material transferred from the donor support forms a uniform layer in the designated recessed surface portions 94 of the subpixels 90 of the TFT substrate 20.

In practice, the donor support 124 is first prepared by providing a transferable coating of an organic EL donor medium thereon by a suitable process forming the donor coating 123. Examples of suitable methods for coating the support include solution coating, meniscus coating, dip coating, spraying, screen printing, and vapor deposition coating in a vacuum chamber. These methods are specifically designed to produce a uniform coating of precise thickness on a donor support which may be a sheet, a rigid support such as glass, a foil, or a flexible web. Using any of these methods, a support coated with a predetermined thickness of the desired transferable EL organic donor medium can be readily prepared in large quantity. A preferred method for the preparation of a flexible donor support, such as for example, a donor web, is the roll-to-roll vacuum coating because the coating thickness and uniformity on the support can be precisely controlled with an accuracy of better than a few percent.

The donor support 124 can be made of any of several materials which meet at least the following requirements. The donor support must be capable of maintaining the structural integrity during the heat-induced transfer step. Additionally, the donor support must be capable of receiving on one surface a relatively thin coating of EL organic donor medium, and of retaining this coating without degradation during anticipated storage periods of the coated support. Support materials meeting these requirements include, for example, metal foils, certain plastic foils with a high glass transition temperature such as Kapton®. While selection of suitable support materials can rely on known engineering approaches, it will be appreciated that certain aspects of a selected support material merit further consideration when configured as a donor support useful in the practice of the invention. For example, the support may require a multi-step cleaning and surface preparation process prior to precoating with a transferable EL organic medium. If the support material is a radiation transmissive material, the incorporation of a radiation-absorptive material on the donor support 124 may be advantageous in enhancing the heat absorption and thus the transfer of donor coating 123 from the donor support 124 to the recessed surface portions 94 of the TFT substrate 20.

The transfer of the EL organic donor medium 123 from the donor support 124 into the recessed surface portions 94 of the TFT substrate 20 can also be caused by translating or scanning a heat source or a light source in proximity to and along the support surface to be heated. While a scanning heat source may increase the total time to form a layer in the designated recessed surface portions 94 of the subpixels 90, a scanning heat source may advantageously reduce excessive heating of the substrate surface and any attendant undesirable crystallization or aggregation of the layer 123d being formed in the subpixel recesses of the substrate.

The aperture mask 112 is conveniently fabricated from a metallic foil or sheet by micromachining methods well known in this art. Such micromachining methods are capable of rendering the plurality of apertures 113 which can be as small as a few micrometers in dimension and, if the aperture mask 112 is to contain a plurality of closely spaced apertures, the distance between adjacent apertures can also be as small as a few micrometers.

The orientation marks 152 (see FIG. 3) of the aperture mask 112 can be apertures through which a directed beam of light can pass, or they can be opaque in appearance. In any event, the orientation marks 152 on the aperture mask 112 are used to position the aperture mask in an oriented relationship with the TFT substrate 20 which has spatially matching or coincident sets of orientation marks (not shown). Aperture masks defining a particular selected color pattern of apertures are advantageously used in the practice of the invention to form full-color organic EL layers in designated recessed surface portions of pixels in correspondence with the selected particular color pattern.

The organic EL media used in the method of forming organic layers in accordance with this invention can take any of the forms, such as those disclosed in the following commonly assigned Tang U.S. Pat. No. 4,356,429; VanSlyke et al U.S. Pat. No. 4,539,507; VanSlyke et al U.S. Pat. No. 4,720,432; Tang et al U.S. Pat. No. 4,885,211; Tang et al U.S. Pat. No. 4,769,292; Littman et al U.S. Pat. No. 5,059,861; VanSlyke U.S. Pat. No. 5,047,687; VanSlyke et al U.S. Pat. No. 5,059,862; VanSlyke et al U.S. Pat. No. 5,061,617; and Tang et al U.S. Pat. No. 5,294,870; the disclosures of which are here incorporated by reference.

As disclosed in Tang et al U.S. Pat. No. 5,294,870, cited above, a plurality of organic layers which, together, are referred to as an EL medium, are known to produce efficient organic electroluminescent devices. For example, an efficient EL layer is formed on the bottom electrodes 72 by sequentially depositing a hole injecting layer, a hole transporting layer, a luminescent layer, and an electron injecting layer.

Numerous organic materials, disclosed in the above-cited references, can be useful to form these organic EL layers on the recessed surface portions of the substrate in accordance with the present invention. Selection of particular organic EL media is influenced, among other considerations, by their ability to provide uniform transferable donor coatings on a donor support, and by their ability to maintain transferable properties during a storage interval between preparation of a coating on the donor support and its deployment in the heat transfer step.

With respect to the patterned organic layers in a full-color organic EL display on the TFT substrate, the light emitting properties of each of the layers are tailored to provide light emission over specific spectral regions of the visible spectrum by incorporating into the donor coating 123 and thereby into the deposited layers 123d a combination of an electroluminescent organic host material and at least one highly fluorescent organic material. A different transferable organic EL coating is precoated on a donor support for each of the primary colors (red, green, and blue) to be obtained in a full-color organic EL display. For example, if the designated red subpixels are to provide light emission in a red spectral region of the visible spectrum, the organic EL host material is combined with a highly fluorescent organic dye tailored to emit red light when such a red light emitting subpixel of a multicolor organic EL display is actuated by at least one of the TFTs 44, 48 corresponding to that particular subpixel. Likewise, if a second selected color of emitted light is to be emitted within a green spectral region, a donor coating 123 is prepared by suitably combining an organic EL host material with a green light emitting highly fluorescent dye. Similarly, if designated recessed surface portions 94 of subpixels 90 are to receive a blue light emitting EL medium, a donor coating consisting of a combination of an organic EL material and a blue light emitting highly fluorescent dye is prepared on the donor support. The hole injecting layer, the hole transport layer, and the electron transport layer, which together perform the charge transport functions, do not require patterning, and therefore can be deposited by a conventional vapor deposition method.

Referring now to FIG. 2, there is shown a simplified rendition of a TFT active matrix array substrate 20 identical to the substrate described with reference to FIG. 1. Like numeral designations denote like parts or functions. The method of forming patterned organic layers in a full-color EL display on the two- dimensional TFT substrate is distinct over the method previously described with reference to FIG. 1, in that the transferable coating 123 of a color forming EL donor material is precoated on one surface of an optical mask which is comprised of a pattern of absorbers 126. The patterned absorbers are formed on a heat transmissive or on a light transmissive optical mask support 129, through which radiation (heat, light) 130 is incident. The incident radiation 130 is preferentially absorbed by the patterned heat absorbers 126, thereby causing the EL medium in coating 123 to be selectively heated and thus transferred as a vapor 123v from the optical mask to the bottom electrodes 72 of the designated color EL subpixels and thus depositing the red, green, or blue color EL subpixels designated at 123d.

When the incident radiation 130 is from a heat source, the patterned absorbers 126 function as heat absorbers. When the incident radiation 130 is from a light source, the patterned absorbers 126 are light absorbers.

The transferable coating 123 on the optical mask is held in contact or close proximity to the substrate during the vapor deposition transfer step. Close proximity is a spacing of less than 250 micrometers between the coating 123 and the raised surface portions 92 of the subpixels.

The method of FIG. 2 of forming a full-color organic EL display on a TFT substrate is preferably practiced in an environment of reduced pressure during the pattern-selective transfer and deposition of the EL medium for each of the color EL subpixels. For simplicity of presentation, the reduced pressure chamber 121 of FIG. 1 is not shown in FIG. 2.

The optical mask support 129 can be of any material which is transmissive to the incident radiation 130 and which provides structural integrity under the conditions of use of the optical mask. Glass, quartz, and sapphire are examples of suitable optical mask support materials.

The pattern of absorbers 126 can, in principle, be made from any material which is capable of preferentially absorbing radiation (heat or light) with respect to the mask support 123. In practicing the method of the invention, at least the following considerations influence the selection of preferred absorber materials: the optical mask should be reusable and, accordingly, should be readily cleanable prior to recoating with a transferable coating of a color forming EL donor material; the patterned absorbers should be highly adherent to the aforementioned mask support materials, and remain highly adherent under the conditions of exposure to high temperature during repeated use of the optical mask.

In view of the above considerations, examples of preferred materials for forming the pattern of absorbers include patterns of carbon, thin metal layer such as chromium, metal/semiconductor alloyed layers such as chromium/germanium multilayers, and a material known in the art as "black chrome."

The incident radiation, depicted by arrows 130, can be from a pulsed light where the pulse width can range from tens of milliseconds to nanoseconds. Alternatively, focused scanning light sources can be used advantageously in the practice of the methods, including laser sources. In using a scanning source, the light source is focused onto a small area (e.g., 1 mm×1 mm) and is swept across the surface of the optical mask. In the scan mode, the light source can either be continuous or pulsed.

Figure 4:
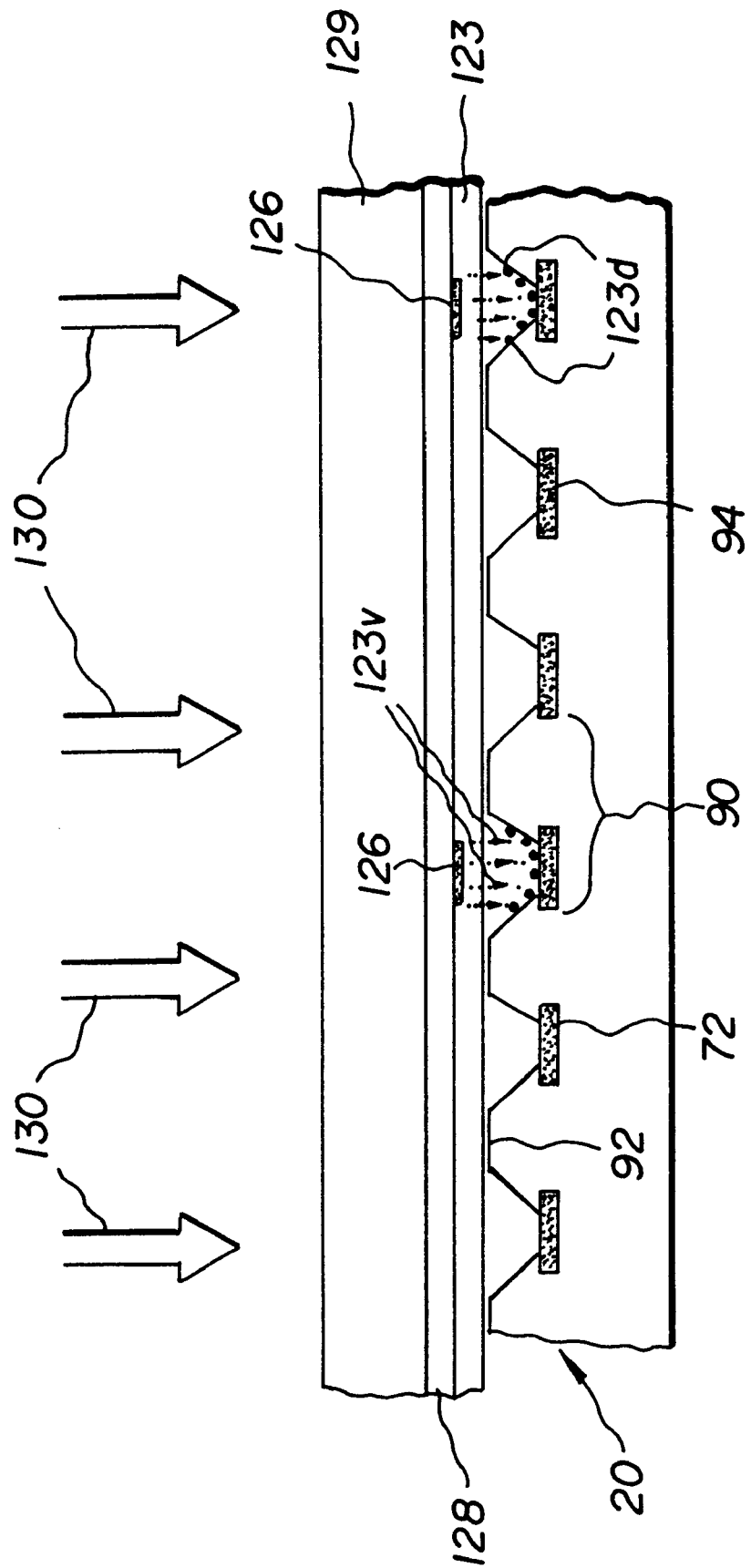
FIG. 4 shows a schematic side view of another optical mask method useful for depositing a color forming organic EL layer into designated subpixels of a TFT substrate in accordance with the present invention.

Referring now to FIG. 4, there is shown a schematic side view of another optical mask method useful for depositing a color forming EL layer into designated subpixels of a TFT substrate. The optical mask of FIG. 4 is distinct over the optical mask of FIG. 2 in that a heat insulating layer 128 is shown as uniformly covering the surface adjacent to the substrate 20 of a radiation transmissive optical mask support 129. On the surface of the heat insulating layer 128 are disposed absorbers 126 which constitute a subpixel pattern for one of the color forming EL media. A transferable coating 123 of a color forming EL donor material is provided over the heat insulating layer 128 and over the patterned absorbers 126.

The transferable coating 123 on the optical mask is held in contact or close proximity to the substrate during the vapor deposition transfer step, as described above with reference to FIG. 2.

The heat insulating layer minimizes heat loss to the optical mask support 129 from the heat absorbers 126, thereby enhancing vapor deposition of the EL layers via vapor paths 123v at a given level of incident radiation (heat or light radiation) as indicated by the arrows 130.

Examples of suitable heat insulating layers 128 include high temperature polymers, for example, polycarbonate, polyimide, and photocrosslinkable resins, low density silica gels, and, in general, any nonabsorbing material of a lower thermal capacity than that of the mask support 129. The heat insulating layer is subject to the same aforementioned considerations of physical integrity as are the optical mask support 129 and the absorbers 126.

Figure 5:
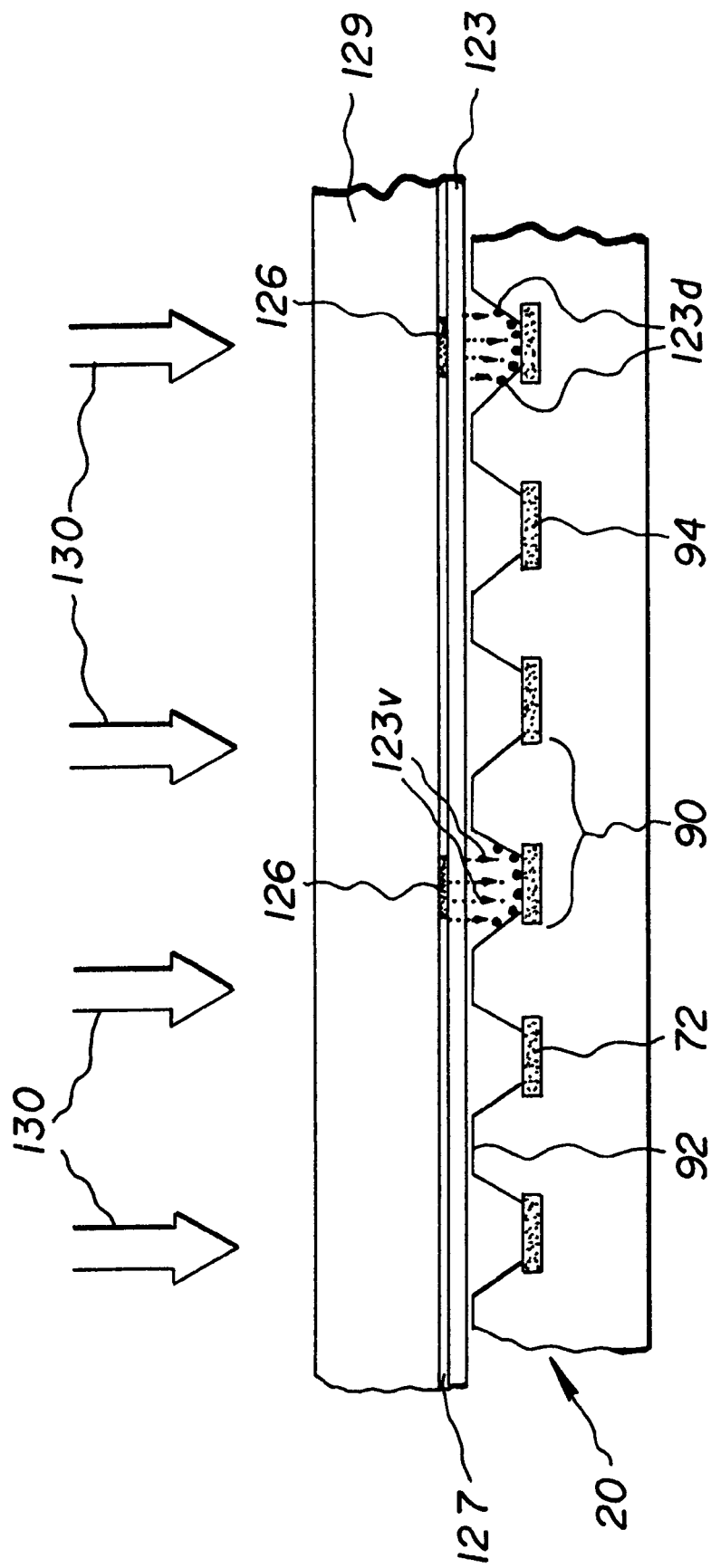
FIG. 5 illustrates in a schematic side view another optical mask method of depositing a color forming organic EL layer into designated subpixels of a TFT substrate in accordance with the present invention.

Referring now to FIG. 5, there is depicted a schematic side view of another optical mask method useful for vapor depositing a color forming organic EL layer into designated subpixels of a TFT substrate. In contrast to the optical mask described with reference to FIG. 2, the optical mask of FIG. 5 has, on the surface of the mask support 129 adjacent to the TFT substrate 20, not only a pattern of absorbers 126, but reflectors 127 disposed on that surface. The reflectors 127 cover the area of the mask support surface between the absorbers 126.

A donor coating 123 of a color forming organic EL medium is formed over the absorbers 126 and over the reflectors 127.

The transferable coating 123 on the optical mask is held in contact or close proximity to the substrate during the vapor deposition transfer step, as described above with reference to FIG. 2.

The reflectors 127 reflect the radiation 130 incident thereon through the radiation transmissive mask support 129, thereby minimizing a temperature increase of the donor EL coating 123 in all coating regions except for the regions defined by the pattern of absorbers 126.

The reflectors 127 are preferably made from a thin film of a reflective metal such as, for example, a thin film of reflective chromium, referred to in the art also as "bright chrome," which is known to be highly adherent to the aforementioned optical mask support materials, and to be abrasion resistant.

Although not shown in FIG. 5 for clarity of presentation, the optical mask method of forming a full-color organic EL display depicted in FIG. 5 is preferably practiced in an environment of reduced pressure during the deposition of the EL medium for each of the color EL subpixels.

Figure 6:
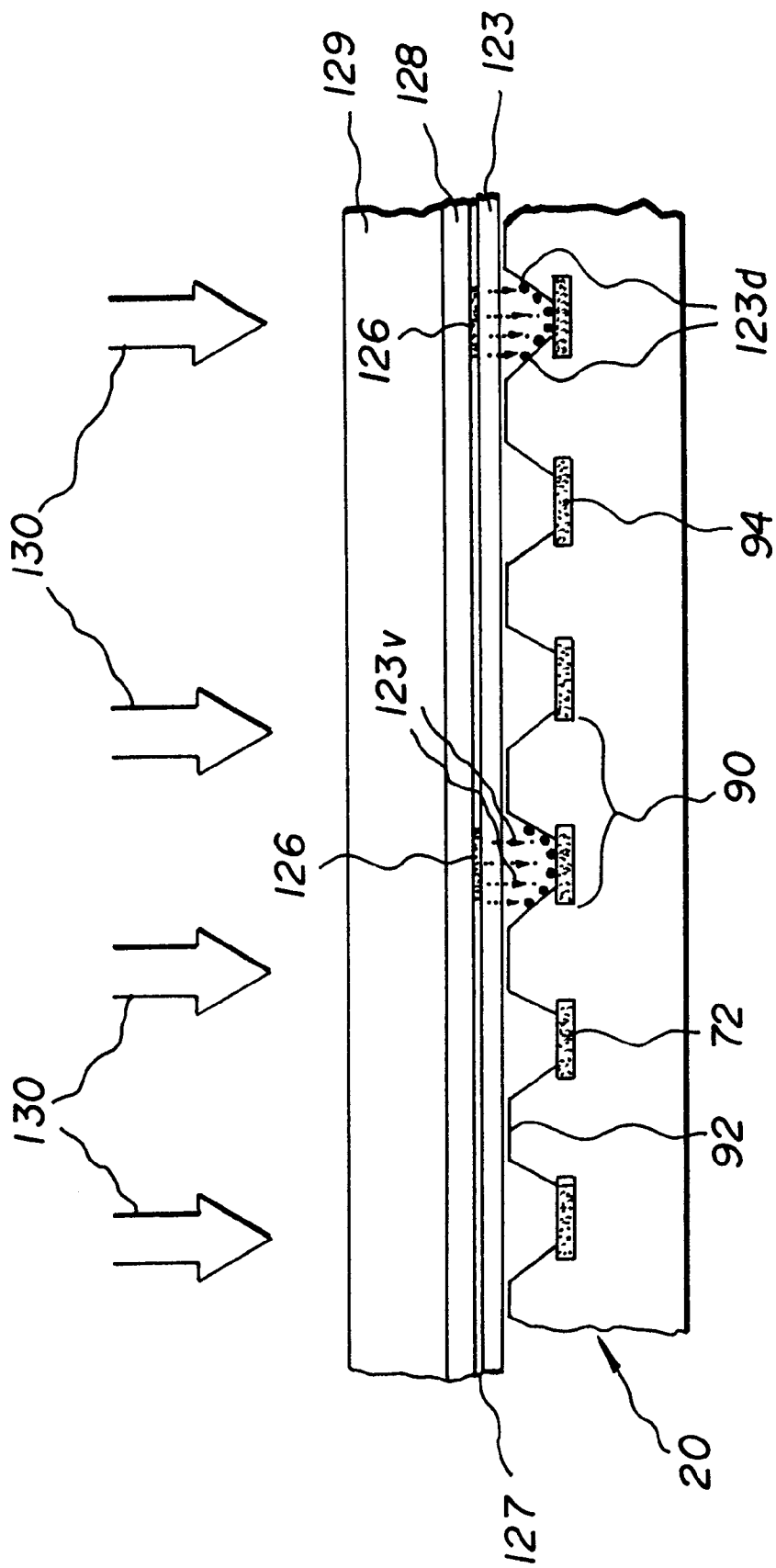
FIG. 6 depicts a schematic side view of still another optical mask method of depositing a color forming organic EL layer into designated subpixels of a TFT substrate in accordance with the present invention.

Referring now to FIG. 6, there is shown another optical mask method of vapor depositing a color forming organic EL layer into designated subpixels of a TFT substrate. Here, the optical mask has, on a surface adjacent to the TFT substrate 20 of the radiation transmissive mask support 129, in sequence, a heat insulating layer 128, a pattern of absorbers 126 with reflectors 127 therebetween, and a donor coating 123 of a color forming organic EL medium. Thus, the method of FIG. 6 combines the features and functions previously described with reference to the optical mask vapor deposition method of FIG. 2, FIG. 4, and FIG. 5.

While one particular configuration and fabrication of a TFT array, and the deposition thereon of a single-color organic EL layer has been described in commonly assigned U.S. Pat. No. 5,550,066 to Tang et al, the present invention contemplates that providing a TFT substrate includes selecting a polysilicon TFT array on a quartz substrate, a polysilicon TFT array on a glass substrate, an amorphous silicon TFT array on a glass substrate, or a TFT array on a crystalline silicon substrate.

Furthermore, it is desirable in certain applications of a full-color organic EL display formed on a TFT substrate to provide the EL emitted light through the top electrode 84. Accordingly, the present invention anticipates providing an organic EL display array on a TFT substrate in which the top electrode 84 is a transparent conductor. Alternatively, for other applications, it is desirable to furnish the bottom electrode 72 as the transparent conductor in a TFT substrate.

The invention has been described in detail, with particular reference to certain preferred embodiments thereof, but it will be understood that variations and modifications can be effected within the spirit and scope of the invention.

PARTS LIST

| | |
|---|---|
| 20 | thin film transistor active matrix array substrate |
| 41 | insulating transparent substrate |
| 44 | thin film transistors (two per pixel) |
| 48 | thin film transistors (two per pixel) |
| 52 | insulating layer |
| 62 | upper electrode |
| 72 | bottom electrode |
| 74 | passivating layer |
| 84 | top electrode |
| 90 | subpixel |
| 92 | raised surface portions of a subpixel |
| 94 | recessed surface portion of a subpixel |
| 112 | aperture mask |
| 113 | plurality of apertures |
| 121 | reduced pressure chamber |
| 122 | pump port |
| 123 | coating of organic EL donor material |
| 123d | deposited BL donor layer |
| 123v | donor vapor |
| 124 | donor support |
| 125 | heating elements |
| 126 | absorbers |
| 127 | reflectors |
| 128 | heat insulating layer |
| 129 | optical mask support |
| 130 | incident radiation |
| 152 | orientation marks |

What is claimed is:

1. A method of forming a full-color organic electroluminescent (EL) display, comprising:
    a) providing a substrate for the EL display which contains an array of thin film transistors (TFls), having a plurality of pixels;
    b) forming each pixel with subpixels designated as red, green, and blue color EL subpixels;
    c) forming each color EL subpixel with an EL element and at least one TFT;
    d) forming each EL element with a bottom electrode on the substrate, an organic EL medium, and a top electrode;
    e) locating the bottom electrode in a recessed portion of the color EL subpixel; and
    f) depositing by vapor deposition the organic EL medium for each of the color EL subpixels through an aperture mask held in contact or close proximity to the substrate.

2. The method of claim 1 wherein the vapor deposition step of the organic EL medium includes the step of transferring by optical or direct thermal means the organic EL medium from a precoated EL donor sheet to the respective bottom electrodes through apertures in the aperture mask.

3. The method of claim 2 wherein the transferring step includes the step of establishing an environment of reduced pressure.

4. The method of claim 1 wherein the organic EL medium for the red color subpixels includes an organic EL host material and a red emitting fluorescent dye, the organic EL medium for the green color subpixels includes an organic EL host material and a green emitting fluorescent dye, and the organic EL medium for the blue color subpixels includes an organic EL host material and a blue emitting fluorescent dye.

5. The method of claim 1 wherein the EL display includes a polysilicon TFT array on a quartz substrate, a polysilicon TFT array on a glass substrate, an amorphous silicon TFT array on a glass substrate, or a TFT array on a crystalline silicon substrate.

6. The method of claim 1 wherein the bottom electrode is a transparent conductor.

7. The method of claim 1 wherein the top electrode is a transparent conductor.

8. A method of forming a full-color electroluminescent (EL) display, comprising:
    a) providing a substrate for the EL display which contains an array of thin film transistors (TFTs), having a plurality of pixels;
    b) forming each pixel with subpixels designated as red, green, and blue color EL subpixels;
    c) forming each color EL subpixel with an EL element and at least one TFT;
    d) forming each EL element with a bottom electrode on the substrate, an organic EL medium, and a top electrode;
    e) locating the bottom electrode in a recessed portion of the color EL subpixel; and
    f) depositing by vapor deposition the organic EL medium for each of the color EL subpixels through an aperture mask held in contact or close proximity to the substrate, wherein
        i) providing, on a mask support surface of the optical mask adjacent to the substrate, a pattern of absorbers, and a layer of a red, a green, or a blue organic EL medium precoated uniformly on the surface; and
        ii) selectively transferring organic EL medium from the optical mask to the bottom electrodes of the designated color EL subpixels.

9. The method of claim 8 wherein the EL display includes a polysilicon TFT array on a quartz substrate, a polysilicon TFI array on a glass substrate, an amorphous silicon TFT array on a glass substrate, or a TFT array on a crystalline silicon substrate.

10. The method of claim 8 wherein the bottom electrode is a transparent conductor.

11. A method of claim 8 wherein the top electrode is a transparent conductor.

12. The method of claim 8 wherein the selective transfer step includes the step of establishing an environment of reduced pressure.

13. The method of claim 8 wherein the organic EL medium for the red color subpixels includes an organic EL host material and a red emitting fluorescent dye, the organic EL medium for the green color subpixels includes an organic EL host material and a green emitting fluorescent dye, and the organic EL medium for the blue color subpixels includes an organic EL host material and a blue emitting fluorescent dye.

14. The method of claim 8 wherein the optical mask has reflectors disposed between the pattern of absorbers on the mask support surface adjacent to the substrate.

15. A method of forming a full-color electroluminescent (EL) display, comprising:
   a) providing a substrate for the EL display which contains an array of thin film transistors (TFTs), having a plurality of pixels;
   b) forming each pixel with subpixels designated as red, green, and blue color EL subpixels;
   c) forming each color EL subpixel with an EL element and at least one TFT;
   d) forming each EL element with a bottom electrode on the substrate, an organic EL medium, and a top electrode;
   e) locating the bottom electrode in a recessed portion of the color EL subpixel; and
   f) depositing by vapor deposition the organic EL medium for each of the color EL subpixels through an aperture mask held in contact or close proximity to the substrate, wherein
      i) forming, on a mask support surface of the optical mask adjacent to the substrate, a uniform heat insulating layer upon which is disposed a subpixel pattern of absorbers, and a layer of a red, a green, or a blue organic EL medium precoated uniformly over the insulating layer and over the absorbers; and
      ii) selectively transferring organic EL medium from the optical mask to the bottom electrodes of the designated color EL subpixels.

16. The method of claim 15 wherein the EL display includes a polysilicon TFT array on a quartz substrate, a polysilicon TFI array on a glass substrate, an amorphous silicon TFT array on a glass substrate, or a TFT array on a crystalline silicon substrate.

17. The method of claim 15 wherein the bottom electrode is a transparent conductor.

18. The method of claim 15 wherein the top electrode is transparent conductor.

19. The method of claim 15 wherein the selective transfer step includes the step of establishing an environment of reduced pressure.

20. The method of claim 15 wherein the organic EL medium for the red color subpixels includes an organic EL host material and a red emitting fluorescent dye, the organic EL medium for the green color subpixels includes an organic EL host material and a green emitting fluorescent dye, and the organic EL medium for the blue color subpixels includes an organic EL host material and a blue emitting fluorescent dye.

21. The method of claim 15 wherein the optical mask support has reflectors disposed between the pattern of absorbers on the heat insulating layer.

* * * * *